United States Patent [19]

Moslehi

[11] Patent Number: 5,219,783
[45] Date of Patent: Jun. 15, 1993

[54] METHOD OF MAKING SEMICONDUCTOR WELL STRUCTURE

[75] Inventor: Mehrdad M. Moslehi, Dallas, Tex.

[73] Assignee: Texas Instruments Incorporated, Dallas, Tex.

[21] Appl. No.: 856,008

[22] Filed: Mar. 20, 1992

[51] Int. Cl.[5] .............................................. H01L 21/70
[52] U.S. Cl. ........................................ 437/57; 437/34; 437/56; 437/235; 437/238
[58] Field of Search .................. 437/34, 56, 57, 235, 437/238, 7, 74

[56] References Cited

U.S. PATENT DOCUMENTS

| 4,013,484 | 3/1977 | Boleky et al. | 437/34 |
| 4,889,828 | 12/1989 | Jeuch | 437/34 |
| 4,968,639 | 11/1990 | Bergonzoni | 437/57 |
| 5,021,358 | 6/1991 | Flanner et al. | 437/57 |
| 5,071,777 | 12/1991 | Gahle | 437/57 |

FOREIGN PATENT DOCUMENTS 0088363 4/1991 Japan ................................ 437/233

OTHER PUBLICATIONS

M. M. Moslehi et al., "Compositional Studies of Thermally Nitrided Silicon Dioxide (Nitroxide)", *J. Electrochem. Soc.: Solid State Science and Technology*, vol. 132, No. 9, Sep. 1985, pp. 2189-2197.

M. M. Moslehi et al., "Thermal Nitridation of Si and $SiO_2$ for VLSI", *IEEE Transactions on Electron Devices*, vol. ED-32, No. 2, Feb. 1985, pp. 106-123.

M. M. Moslehi et al., "Rapid thermal nitridation of $SiO_2$ for nitroxide thin dielectrics", *Appl. Phys. Lett. 47*, vol. 47, No. 10, 15 Nov. 1985, pp. 1113-1115.

Primary Examiner—Tom Thomas
Attorney, Agent, or Firm—Ira S. Matsil; James C. Kesterson; Richard L. Donaldson

[57] ABSTRACT

A method of forming doped well regions in a semiconductor layer 14 is disclosed herein. At least one n-doped region 30 and at least one p-doped region 36 are formed in the semiconductor layer 14. The n-doped region 30 is separated from the p-doped region 36 by a separation region 39. An oxide layer 32 (38), for example silicon dioxide, is formed over the n-doped region 30 and p-doped region (36) but not over the separation region 39. The semiconductor layer 14 is then heated (e.g., at a temperature of less than 1150° C.) in a nitridizing environment such as ammonia. Other structures and methods are also disclosed.

24 Claims, 4 Drawing Sheets

METHOD OF MAKING SEMICONDUCTOR WELL STRUCTURE

This invention was made with government support under contract no. F33615-88-C-5448 awarded by the United States Air Force. The government may have certain rights in this invention.

FIELD OF THE INVENTION

This invention generally relates to the fabrication of semiconductor devices and specifically to a method for forming doped well structures in a semiconductor layer or substrate.

BACKGROUND OF THE INVENTION

Advanced CMOS (complementary metal-oxide-semiconductor) and BiCMOS (bipolar and complementary metal-oxide-semiconductor), as well as some other device technologies, require the formation of doped N or P wells or both N and P wells in bulk silicon or epitaxial (for example, a P$^-$ epi-layer on a P$^+$ substrate or an N$^-$ epi-layer on an N$^+$ substrate) wafers. The well formation process is usually based on ion implantation of boron (for P-well) or phosphorus (for N-well) followed by a long (e.g., a few hours), high-temperature (e.g., 1100° to 1200° C.) furnace anneal in an inert or oxidizing ambient.

The relatively long furnace anneal is required to required to form deep N and P well regions via thermal diffusion. The well junction depth is usually at least a few times larger than the source/drain junction depths. For instance, a 0.35 $\mu$m CMOS technology may require N and P wells with greater than one micron well-to-substrate junction depth.

If the well formation process is to be performed in a single-wafer-based semiconductor factory, the time and temperature requirements for a single-wafer well drive-in process can be rather excessive (e.g., temperatures of 1100°–1200° C. for more than 30 min.) resulting in low manufacturing throughput. This requirement could make the manufacturing costs unbearably high.

Moreover, conventional furnace diffusion processes for formation of diffused wells cause lateral diffusion of both N and P dopants, resulting in lateral dopant compensation. This undesirable lateral diffusion places a limit on the minimum N-to-P well spacing and makes device layout scaling more difficult.

As a result, there is a need for an RTP (rapid thermal processing) based well formation process which can form the necessary N and P well regions based on reasonable RTP temperature/time conditions. Moreover, there is a need for a well formation process which can form the wells of desired depths using reduced temperature/time process parameters without excessive lateral interdiffusion of the N and P well dopants.

SUMMARY OF THE INVENTION

Other objects and advantages will be obvious, and will in part appear hereinafter and will be accomplished by the present invention which provides a method and structure for a semiconductor well.

A method of forming a doped well in a semiconductor layer or substrate is disclosed herein. At least one N-doped region and at least one P-doped region are formed in the semiconductor layer or substrate. The N-doped region is separated from the P-doped region by a separation region. An oxide layer, for example silicon dioxide, is formed over the N-doped region and P-doped region but not over the separation region. The semiconductor layer is then heated (e.g., at a temperature of less than 1150° C. for less than ten minutes) in a nitridizing environment such as ammonia.

In a preferred embodiment, a first oxide layer (e.g., SiO$_2$), a first polysilicon layer, a second oxide layer, a second polysilicon layer, and a silicon nitride layer are formed on the surface of the semiconductor layer or substrate. The silicon nitride layer and the second polysilicon layer are then patterned and etched to define a first well region. In other words, the first well region is beneath the remaining portion of the nitride layer and the first polysilicon layer (herein referred to as the remaining portion for short). Sidewall spacers (e.g. via silicon nitride deposition and reactive ion etch) are then formed adjacent the remaining portion. A second well region, not beneath the remaining portion, is then doped. An oxide layer is formed selectively over the second well region. Next, the remaining portion is selectively removed and the first well region is doped. The semiconductor layer is then heated in the nitridizing environment such that dopants tend to diffuse vertically into the semiconductor layer or substrate. The lateral dopant diffusion is reduced due to nitridation-retarded diffusion (NRD). The vertical dopant diffusion is enhanced due to oxynitridation-enhanced diffusion (ONED).

One advantage of the invention is that dopants tend to diffuse into the semiconductor layer at a greater rate than they diffuse laterally. Therefore, significant lateral counter doping is avoided and higher quality devices may be fabricated in reduced substrate area.

In addition, this invention can be utilized in either multi-wafer or single-wafer processing chambers. The reasonable time (e.g., less than ten minutes) and temperature (e.g., less than 1150° C.) requirements make the process practical in a high-volume manufacturing environment. This is especially true for single-wafer processing equipment where the processing time per wafer is critical since wafers are processed one at a time.

A further advantage is that only one microlithography masking step is required to perform the preferred embodiment process sequence. Often, the masking steps are the process flow bottleneck and therefore the minimization of masking steps in desirable.

Yet another advantage of this invention is that the one-mask process forms both the N-well and P-well regions without producing any nonplanar topography or step on the substrate. A planar device structure is produced which is preferred for subsequent microlithography steps.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

Figure 1:
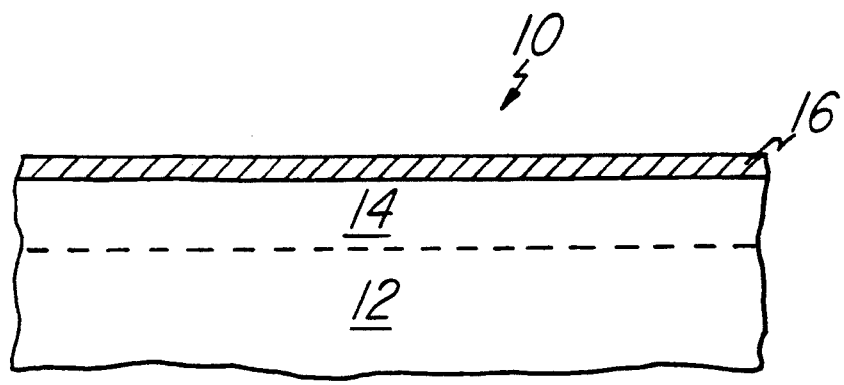
FIGS. 1 through 7 are cross-sectional views of an exemplary embodiment device during various stages of the process flow.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The present invention is related to co-pending application Ser. No. 869,423 filed on Apr. 16, 1992.

The following is a description of the structure and method of the present invention. The preferred embodiment will be described first followed by a description of modifications. An application example will then be briefly described.

The present invention proposes a useful and practical process based on RTP (rapid thermal processing) or standard furnace processing which can be used to form N and/or P wells for technologies such as advanced submicron CMOS (complementary metal-oxide-semiconductor) or BiCMOS (bipolar and complementary metal-oxide-semiconductor on same chip) technologies. The process flow described herein allows optimization of the CMOS wells without any need for MeV (megaelectron-volt) or very high energy ion implantation steps and without significant process throughput limitation problems.

In one aspect, the process utilizes two main features. The first feature is an effect known as "oxynitridation-enhanced diffusion" or "ONED." This effect is used during the RTP well drive-in cycle to cause a significant enhancement of the boron and phosphorus diffusion in the vertical direction. This effect can be much stronger than the so-called "oxidation-enhanced diffusion" or "OED" effect for boron and phosphorus and allows for a reduction in the well diffusion time and temperature requirements. Further, the OED method is not typically considered desirable since silicon is consumed through thermal oxidation. The ONED effect on the other hand consumes only a negligible amount of silicon.

Another effect known as "nitridation-retarded diffusion" or "NRD" is also utilized. This effect is used in order to minimize the lateral diffusivities of boron and phosphorus during the RTP well formation. This will allow closer spacings between N and P wells due to reduced lateral dopant compensation and reduced lateral N and P well diffusions.

For more information on oxidation and nitridation, see the following papers:

1) Moslehi et al. "Thermal Nitridation of Si and $SiO_2$ for VLSI", *IEEE Transactions on Electron Devices*, Vol. ED-32, No. 2, February 1985, pp. 106–123.

2) Moslehi et al. "Compositional Studies of Thermally Nitrided Silicon Dioxide (Nitroxide)", *Journal of the Electrochemical Society*, Vol. 132, No. 9, September 1985, pp. 2189–2197.

3) Moslehi et al. "Rapid Thermal Nitridation of SiO2 for Nitroxide Thin Dielectrics", *Appl. Phys. Lett.* 47 (10), Nov. 15, 1985, pp. 1113–1115.

The RTP and standard furnace based CMOS well formation process proposed herein is fully compatible with standard CMOS and BiCMOS technologies. The electrical characteristics of the wells (e.g., crystal quality) are expected to be as good as those of the conventional CMOS wells. In the process flow described herein, only one microlithography mask is used to form both N and P wells.

For the example used to describe the process flow, it is assumed that both N and P wells are formed on $P^-$e-pi/$P^+$ wafers. The use of epitaxial material is known to be very helpful for CMOS latch-up immunity. To describe the proposed flow, it is assumed that the object is to form 1.0 to 1.5 $\mu$m deep wells on $P^-$/$P^+$ epitaxial wafers. Typically the epitaxial semiconductor thickness is between 2 and 4 microns.

Although described with respect to a specific embodiment, the present invention may be performed in a variety of environments. For example, the substrate may be bulk silicon or an epitaxial grown layer grown on bulk semiconductor or on an insulator such as any of the known SOI (semiconductor-on-insulator technologies). In addition, the process may be performed in a single-wafer or multi-wafer processing chamber.

The process steps of the preferred embodiment will now be described with respect to FIGS. 1 through 7. A cross sectional view of an exemplary application will then be shown in FIG. 8.

Referring first to FIG. 1, a semiconductor workpiece 10 comprises a P+ silicon substrate 12 over which P− epitaxial layer 14 is formed. As previously mentioned, the doping of the workpiece may vary (e.g., P type, N type, intrinsic) depending upon the application.

An oxide layer 16 is formed on the surface of layer 14. In the preferred embodiment, the oxide layer 16 comprises silicon dioxide and is formed by thermal oxidation. The oxide layer 14 may also be deposited by LPCVD (low-pressure chemical-vapor deposition) or PECVD (plasma-enhanced chemical-vapor deposition). The oxide layer 16 is typically between about 100 and 1000 Å thick and preferably about 250 Å thick.

Figure 2:
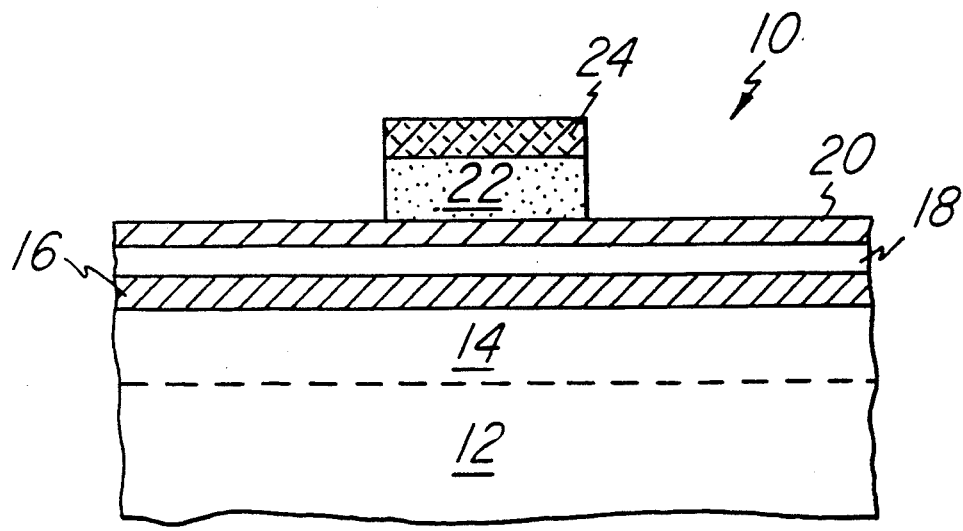

Referring now to FIG. 2, a semiconductor layer 18 is formed over oxide layer 16. The layer 18 may be either polycrystalline or amorphous silicon and is typically between about 200 and 1000 Å thick. The presently preferred thickness is about 500 Å.

Next, a thin (e.g., about 20 to 100 Å) oxide layer 20 is formed over polysilicon layer 18 by either chemical oxide growth or thermal oxidation means.

A relatively thick layer 22 of polysilicon is then formed using standard processes. For example, an LPCVD process may be performed. The polysilicon layer 22 is typically between about 8000 and 20,000 Å thick and is preferably about 10,000 Å thick.

The next step in the preferred embodiment process flow is to form a top layer 24 of silicon nitride ($Si_3N_4$). In one example, the nitride layer 24 may be formed by LPCVD or PECVD. This layer 24 is typically between about 2000 and 6000 Å thick and is preferably about 5000 Å thick.

The nitride layer 24 and polysilicon layer 22 are then patterned, possibly with a CMOS well mask (not shown). An anisotropic etch of the top nitride 24 and top polysilicon layer 22 is then performed to create the structure illustrated in FIG. 2. During this etch step, the thin inner oxide layer 20 will serve as an etch stop. In this embodiment, the layers 22 and 24 are formed and patterned above what will be the P-well region in layer 14 while the portions of layer 14 not beneath the layers 22 and 24 will be N-well regions. Of course, the N and P wells may be reversed (in terms of fabrication process order).

It should be noted that a top layer (e.g., about 500 Å thick) of polysilicon (not shown) may be formed above the nitride layer 24. This layer may then be used in subsequent steps as a nitride etch stop. For example, this polysilicon etch stop layer may be used during the formation of sidewall dielectric spacers.

Figure 3:
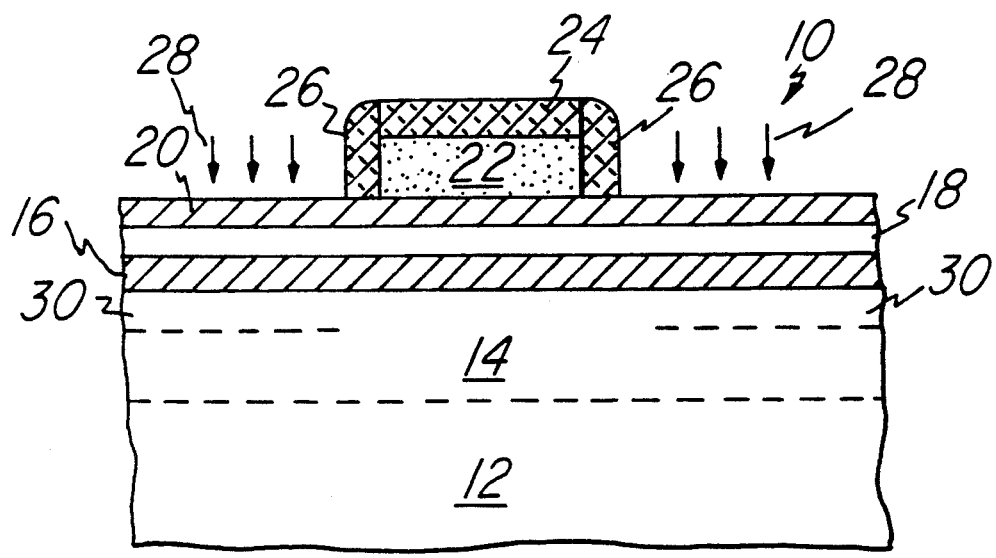

Referring now to FIG. 3, sidewall spacers 26 are formed. For example, a conformal layer of nitride 26 is deposited by either LPCVD or PECVD and then anisotropically etched to form the nitride spacers 26.

It is noted that a portion of the nitride layer 24 will be etched away during the over-etch process for the dielectric spacer formation. Therefore, a controlled process is needed to ensure at least a portion of nitride layer 24 remains. As noted earlier, a polysilicon layer (not shown) may alternatively be included above nitride layer 24 to serve as an etch stop, if necessary.

The next step is to perform an N-well dopant such as phosphorus implantation. This step is illustrated in FIG. 3 by the arrows 28. Typically, this is a double implant but may also be a single or triple implant at various doses and energies. Other N-type dopants, including but not limited to arsenic and antimony, may also be used. The implanted region in layer 14 is denoted by the dashed lines and the numeral 30.

Figure 4:
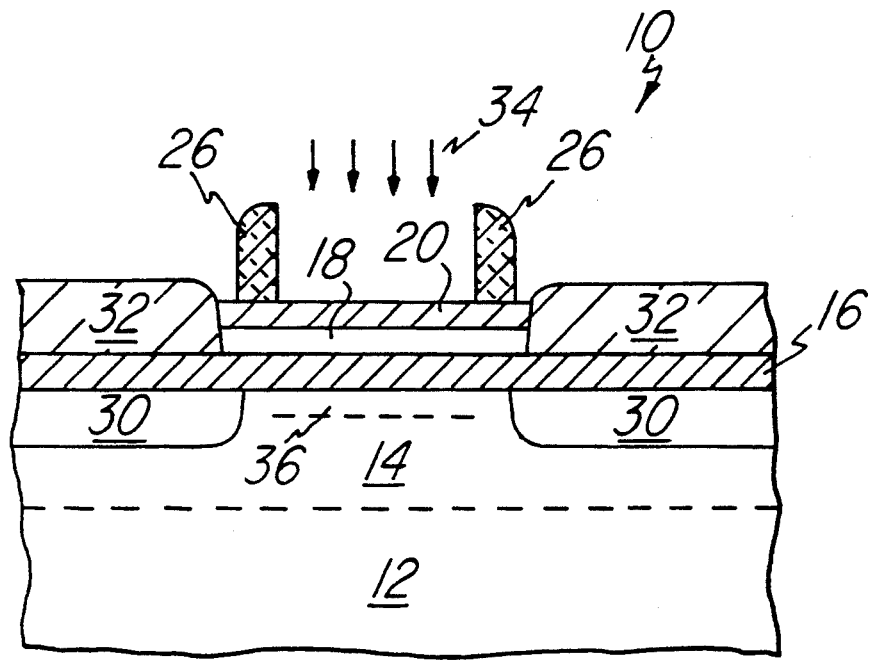

Referring now to FIG. 4, along with FIG. 3, a thermal oxidation is performed to consume the exposed portions of polysilicon layer 18 and create oxide regions 32. As is known, the silicon dioxide regions 32 will include approximately 2.2 times the thickness of the polysilicon layer 18. It is noted that the thick polysilicon layer 22 is not oxidized because of the nitride oxidation mask layer 24. In addition, the oxidation process is stopped before oxidizing the substrate 14. In other words, only portions of the polysilicon layer 18 are oxidized, and the thermal oxidation is stopped before the start of substrate oxidation.

The next step in the preferred embodiment is to perform a short oxide deglaze followed by an anisotropic (not isotropic because it is desired to keep the spacers 26) selective nitride etch and a selective isotropic or anisotropic polysilicon etch to remove nitride layer 24 and polysilicon 22. The resulting structure is illustrated in FIG. 4.

The next step is to perform a P-well implantation. This step is illustrated in FIG. 4 by the arrows 34. Typically, this step comprises a double implant, but the step may alternatively be a single or a triple implant with various doses and energies. The preferred P-type dopant is boron but other dopants such as aluminum or gallium may also be used. In FIG. 4, the implanted region in layer 14 is denoted by the dashed lines and the region 36.

During the implantation process, the spacers 26 serve as an implant mask and as such there are unimplanted regions 39 between the N regions 30 and the P regions 36. These unimplanted regions 39 may be referred to as N-to-P well separation regions 39 since they separate the well regions 30 and 36. It is noted that the separation regions 39 may be doped to a selected level, especially if the semiconductor layer 14 has been doped.

Although discussed herein as a N-well region 30 and a P-well region 36, the regions 30 and 36 may both be N-well regions or both be P-well regions as required by the specific device application.

Figure 5:
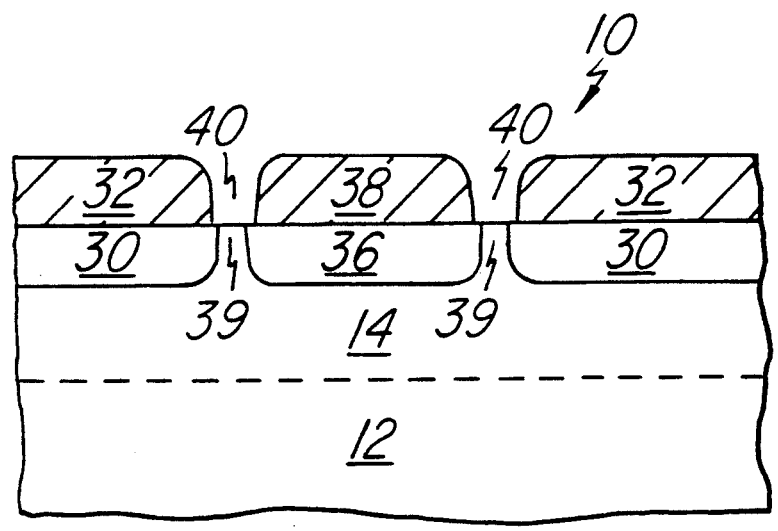

As illustrated in FIG. 5, the next step is to perform a thermal oxidation to grow oxide region 38. The oxide region 38 is typically between about 500 Å and 2000 Å and will once again depend upon the thickness of polysilicon layer 18. The thermal oxidation can be long enough to consume the entire poly layer 18 over the P well regions 36. This oxidation step may be skipped, if desired, since the thin oxide pad 16 already exists over the P-well region 36. (In FIG. 5, the oxide layer 16 has been illustrated as being a part of oxide regions 32 or 38.)

A short oxide deglaze is then performed followed by isotropic nitride and isotropic poly etch steps. These etches will remove spacers 26 as well as the remaining portion of polysilicon layer 18 which was underneath the spacers. After the isotropic poly etch, a short oxide deglaze is performed to remove the remaining thin oxide on the surface of layer 14 between the N-well region 30 and P-well region 36 over the separating regions 39. This step will leave exposed silicon surfaces 40 between oxide regions 32 and 38. It should also be noted that oxide regions 32 and 38 need not be the same thickness. In fact, oxide region 32 may be thicker due to the additional oxidation.

The next step in the preferred process flow is to perform the RTP or furnace well formation by annealing the workpiece in a nitridizing environment. In the preferred embodiment, the temperature is less than 1150° and preferably between about 1050° and 1150° C. The typical anneal times will be less than ten (or possibly five) minutes. This feature provides a throughput advantage. The preferred nitridizing environment comprises an ammonia ($NH_3$) ambient.

Figure 6:
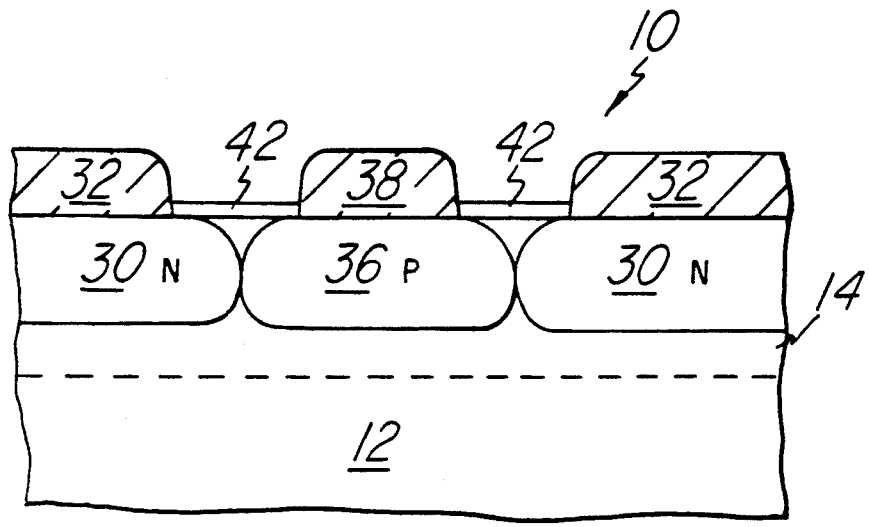

The oxide regions 32 and 38 over the implanted N and P well regions 30 and 36 will cause significant vertical diffusion enhancement via the ONED effects for boron and phosphorus. However, the exposed silicon surfaces 40 between the N and P well regions 30 and 36 will reduce the lateral diffusivities of boron and phosphorus via the NRD effects (direct nitridation of exposed silicon surfaces). The workpiece after the anneal step is illustrated in FIG. 6. Also illustrated in FIG. 6 are the nitride layers 42 which form on the silicon surface 40 during the ammonia anneal.

Figure 7:
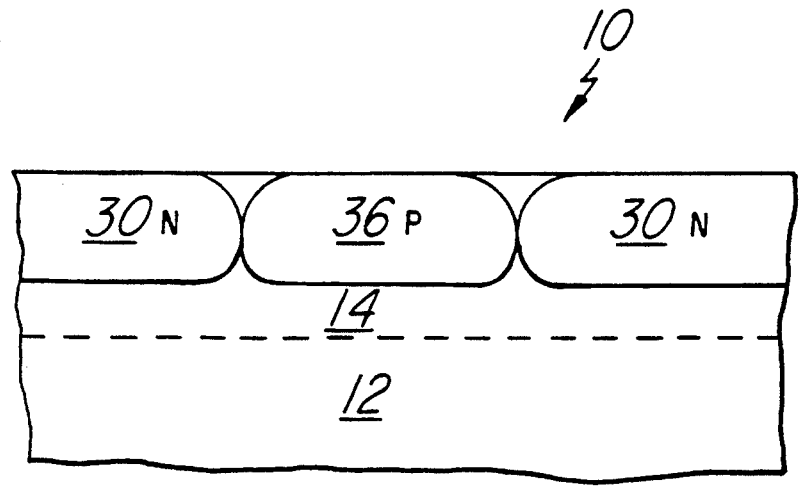

If desired, a short steam oxidation may be performed to consume the thin silicon nitride regions 42. An oxide deglaze (e.g. wet HF etch) may then be performed to remove nitrided oxide regions 32 and 38 and other films from the surface of substrate 14. Alternatively, a wet etch may be performed without any initial steam oxidation. The substrate, illustrated in FIG. 7, is now ready to proceed with the remaining processing steps for device fabrication.

The substrate 10 which includes N-well regions 30 and P-well regions 36 may be used in a great number of applications. It is noted that the application in which the substrate 10 is used is not critical to this invention.

Figure 8:
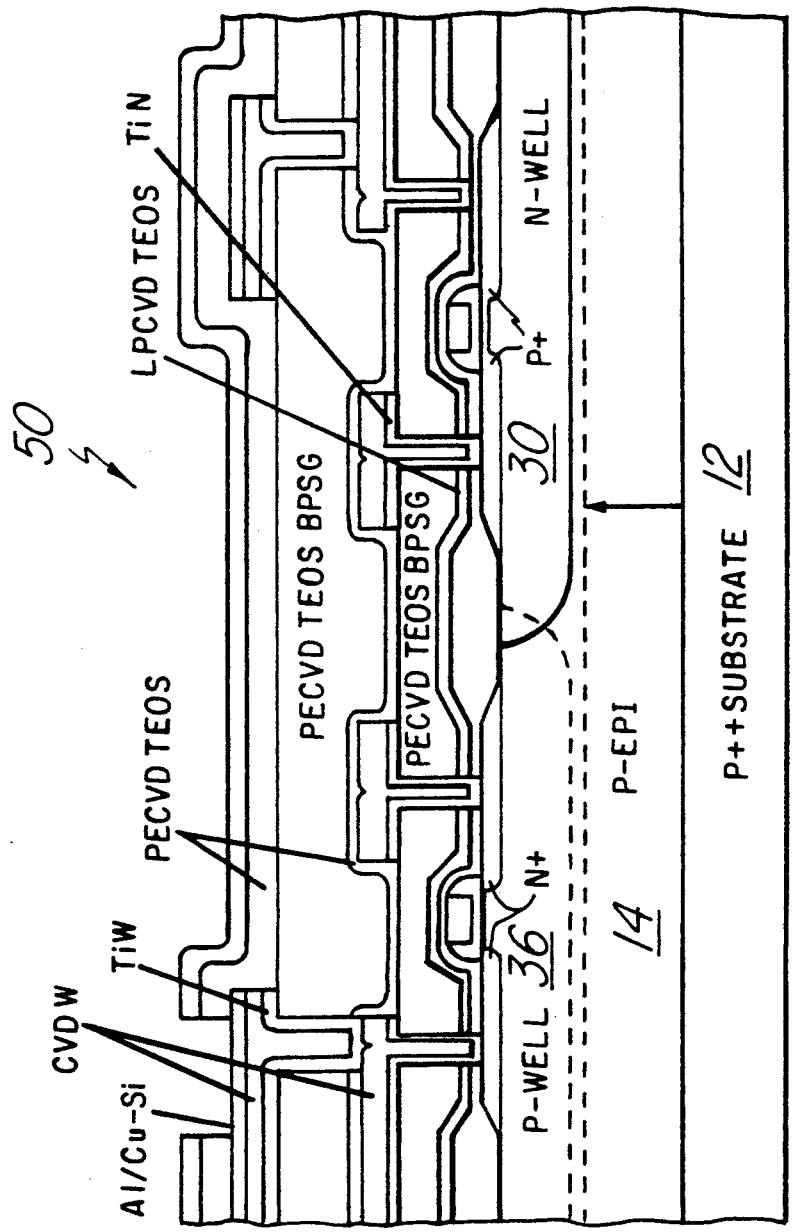
FIG. 8 is a cross-sectional view of an exemplary circuit which utilizes the well structure of the present invention.

Referring now to FIG. 8, one exemplary cross-sectional device structure 50 is illustrated. The CMOS device structure 50 includes P-well region 36 and N-well region 30 and is included herein to illustrate one of the many possible applications of the process of present invention.

Although described herein for both N and P-wells, the present invention may be utilized to form wells of the same conductivity type. For example, if an application required two P-wells (or two N-wells) with different doping concentrations, the present invention could be utilized to perform this task.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming doped N and P-wells in a silicon layer comprising the steps of:
    forming at least one n-doped region and at least one p-doped region in said silicon layer, said N-doped region separated from said P-doped region by a N-to-P well separation region;
    forming a silicon dioxide layer over said at least one N-doped region and over said at least one P-doped region but not over said separation region such that an upper surface of said separation region comprises an exposed semiconductor surface; and
    heating said silicon layer in a nitridizing environment wherein vertical diffusion of dopants is enhanced in said well regions and lateral diffusion of dopants into said separation region is retarded.

2. The method of claim 1 wherein said nitridizing environment comprises an environment with an ammonia ambient.

3. The method of claim 1 wherein said heating step comprises heating to a temperature between about 1000° and 1150° C.

4. The method of claim 1 wherein said heating step comprises heating for a period of less than ten minutes.

5. The method of claim 1 wherein said N-doped region comprises a region doped with phosphorus.

6. The method of claim 1 wherein said P-doped region comprises a region doped with boron.

7. The method of claim 1 wherein said silicon layer comprises an epitaxially grown silicon layer.

8. The method of claim 1 wherein said heating step is performed in rapid thermal processing equipment.

9. The method of claim 1 wherein said step of forming at least one N-doped and at least one P-doped region comprises using only one microlithography patterning step.

10. The method of claim 1 wherein said separation region is doped to a selected level.

11. The method of claim 1 wherein said semiconductor layer comprises a doped semiconductor layer.

12. A method of forming doped well regions in a silicon layer comprising the steps of:
    forming a multilayer structure on the surface of said silicon layer;
    etching a portion of said multilayer structure to define a first doped well region beneath the remaining portion of said multilayer structure and to expose a second doped well region;
    forming well-to-well separation regions adjacent said remaining portion of said multilayer structure;
    doping said second well doped region;
    forming a silicon dioxide layer over said second doped well region;
    removing at least a portion of said remaining portion of said multilayer structure;
    doping said first doped well region; and
    heating said silicon layer in a nitridizing environment such that dopants diffuse into said silicon layer.

13. The method of claim 12 wherein said multilayer structure comprises an a first oxide layer, a first polysilicon layer, a second oxide layer, a second polysilicon layer and a nitride layer.

14. The method of claim 12 wherein said nitridizing environment comprises a environment with an ammonia ambient.

15. The method of claim 12 wherein said heating step comprises heating to a temperature less than about 1150° C.

16. The method of claim 12 wherein said heating step comprises heating for a period of less than ten minutes.

17. The method of claim 12 wherein said first well region comprises a region doped with phosphorus.

18. The method of claim 17 wherein said second well region comprises a region doped with boron.

19. The method of claim 12 wherein said silicon layer comprises an epitaxially grown silicon layer.

20. The method of claim 12 wherein said first well region is doped with N-type impurities and said second well region is doped with P-type impurities.

21. A method of forming a doped well in a silicon layer comprising the steps of:
    forming a first silicon dioxide layer on the surface of said silicon layer;
    forming a first polysilicon layer on said first silicon dioxide layer;
    forming a second silicon dioxide layer on said first polysilicon layer;
    forming a second polysilicon layer on said second silicon dioxide layer;
    forming a silicon nitride layer on said second polysilicon layer;
    etching said silicon nitride layer and said second polysilicon layer to define a first well region beneath the remaining portion of said nitride layer and said first polysilicon layer;
    forming sidewall spacers adjacent said remaining portion;
    doping a second well region not beneath said remaining portion;
    forming a third silicon dioxide layer over said second well region;
    removing said remaining portion;
    doping said first well region; and
    heating said silicon layer in an ammonia ambient environment such that dopants tend to diffuse into said silicon layer.

22. The method of claim 21 wherein said semiconductor layer comprises silicon and said oxide layers comprises silicon dioxide.

23. The method of claim 22 wherein said first silicon dioxide is formed by thermal oxidation.

24. The method of claim 21 wherein said steps of forming a silicon dioxide layer, forming a polysilicon layer and forming a silicon nitride layer comprise deposition steps.

* * * * *